(12) United States Patent
Molla et al.

(10) Patent No.: US 7,829,980 B2
(45) Date of Patent: Nov. 9, 2010

(54) MAGNETORESISTIVE DEVICE AND METHOD OF PACKAGING SAME

(75) Inventors: Jaynal A. Molla, Gilbert, AZ (US); Eric J. Salter, Scottsdale, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 424 days.

(21) Appl. No.: 11/739,625

(22) Filed: Apr. 24, 2007

(65) Prior Publication Data

US 2008/0266938 A1 Oct. 30, 2008

(51) Int. Cl.
*H01L 23/552* (2006.01)
(52) U.S. Cl. .................................. 257/659; 257/660
(58) Field of Classification Search .............. 438/108; 365/158; 257/659
See application file for complete search history.

(56) References Cited

U.S. PATENT DOCUMENTS

| 5,939,772 | A | 8/1999 | Hurst et al. |
| 6,916,668 | B2 | 7/2005 | Spielberger et al. |
| 7,078,243 | B2 * | 7/2006 | Spielberger et al. ............ 438/3 |
| 2006/0019422 | A1 * | 1/2006 | Tuttle et al. .................... 438/55 |
| 2006/0205177 | A1 * | 9/2006 | Smith ......................... 438/455 |

OTHER PUBLICATIONS

Gao et al., Magnetic Shielding for Stacked MRAM Packages, Semiconductor International, Dec. 1, 2006.

* cited by examiner

*Primary Examiner*—W. David Coleman
*Assistant Examiner*—Christine Enad
(74) *Attorney, Agent, or Firm*—Ingrassia Fisher & Lorenz, P.C.

(57) ABSTRACT

A magnetoresistive memory device 20 includes dies 24 and 38, each of which contains magnetically sensitive material 50. A method 64 of packaging the magnetoresistive memory device 20 entails coupling the die 24 to a substrate 22, forming interconnections 52 between bonding pads 32 on the die 24 to connection sites 54 spaced apart from the die 24. A magnetic shield 36 is bonded to a top surface 30 of the die 24 following formation of the interconnections 52. The die 38 is attached to the magnetic shield 36, interconnections 56 are formed between bonding pads 44 on the die 38 to connection sites 58 spaced apart from the die 38, and a magnetic shield 48 is adhered to the die 38 following formation of the interconnections 56.

6 Claims, 3 Drawing Sheets

MAGNETORESISTIVE DEVICE AND METHOD OF PACKAGING SAME

TECHNICAL FIELD OF THE INVENTION

The present invention relates generally to shielding semiconductor devices in stacked chip scale packaging. More specifically, the present invention relates to shielding for semiconductor devices having magnetically sensitive material used therein.

BACKGROUND OF THE INVENTION

Magnetic materials are used, for example, in magnetic memory cells and magnetic sensors. A Magnetoresistive Random Access Memory (MRAM) is a non-volatile computer memory technology that uses magnetic charges to store data. A MRAM includes an array of magnetoresistive memory elements or cells. In one example, each memory cell typically has a structure that includes multiple magnetic layers separated by various non-magnetic layers. In general, storing data is accomplished by applying magnetic fields to the magneto resistive memory cells, and thereby causing the magnetic material in the memory cells to be magnetized into either of two possible memory states. Recalling data is accomplished by sensing resistance changes in the memory cell when magnetic fields are applied. The magnetic fields are created by passing currents through word lines external to the magnetic structure or through the magnetic structures themselves.

There is a growing interest in the development and use of MRAM devices for data retention because an MRAM combines the speed of static random access memory with the non-volatility of flash memory. In addition, MRAM has relatively low power consumption, good reliability characteristics, and suffers little degradation over time in comparison to Flash memory. Unfortunately, a problem with MRAM devices is that interference from any external magnetic field can cause errors during programming.

Due to its advantages of speed, non-volatility, relatively low power consumption, reliability, and durability, it is desirable to provide a magnetoresistive memory device and packaging methodology that results in a high performance memory having higher effective density than prior art devices. Moreover, the magnetoresistive memory device must be effectively shielded to prevent problems associated with external magnetic fields.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
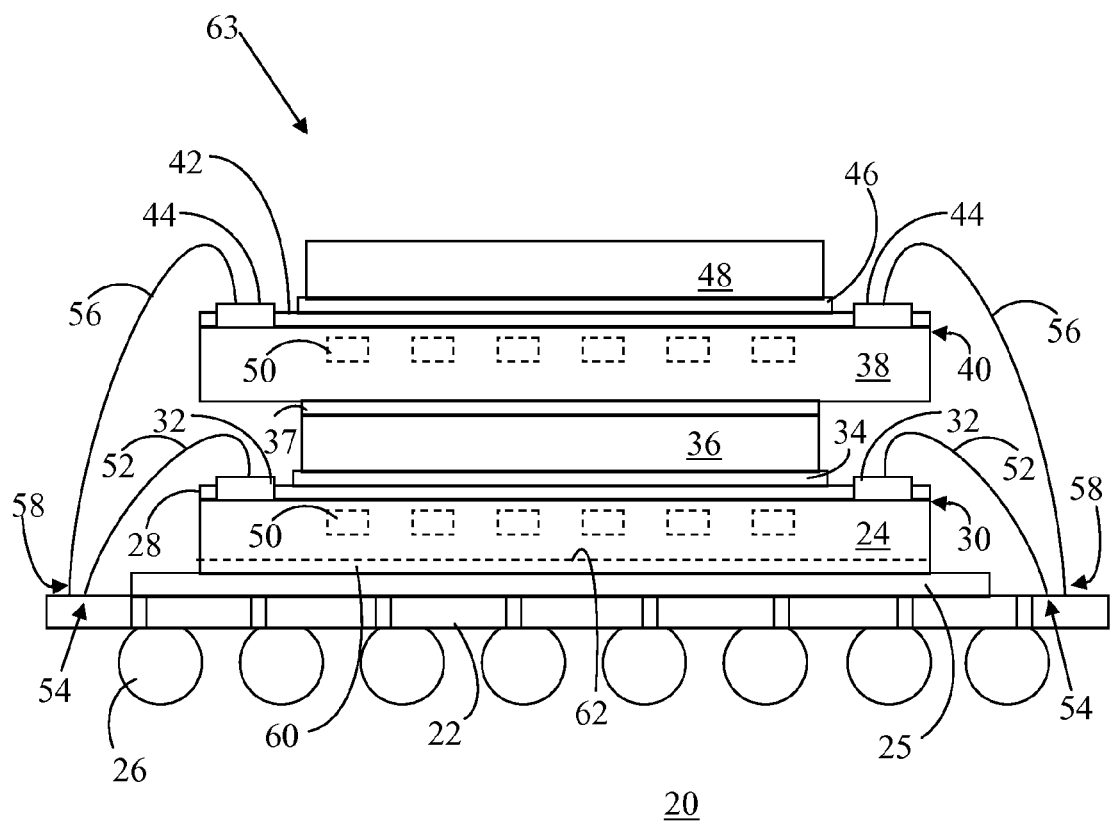
FIG. 1 shows a side view of a magnetoresistive memory device in accordance with one embodiment of the present invention.

FIG. 1 shows a side view of a magnetoresistive memory device 20 in accordance with one embodiment of the present invention. Magnetoresistive memory device 20 includes a dielectric substrate 22 upon which a die 24 is coupled by, for example, a conductive adhesive 25. Magnetoresistive memory device 20 may be fabricated utilizing ball grid array (BGA) surface mount techniques to achieve high density and high performance memory capacity while enabling manufacturers to minimize the overall size of the package. Accordingly, solder balls 26 are adhered to the bottom of substrate 22 for attachment with copper pads (not shown) arranged in a pattern on a printed circuit board (not shown) that matches solder balls 26. Per convention, memory device 20 is heated causing solder balls 26 to melt. Surface tension causes the molten solder to hold memory device 20 in alignment with the circuit board, at the correct separation distance, while the solder cools and solidifies. Although a BGA surface mount technique is discussed herein, other conventional and upcoming mounting techniques may alternatively be utilized.

Die 24 includes a stress buffer material 28 coating a top surface 30 of die 24. Die 24 further includes bonding pads 32 located near a perimeter of die 24. In one embodiment, stress buffer material 28 may be polyimide. Polyimide stress buffer material 28 can be applied by spin coating top surface 30. A spin coating process causes a solution of material 28 to be dispensed over top surface 30 including bonding pads 32. Spin is adjusted to get a desired thickness of stress buffer material 28. Stress buffer material 28, such as polyimide, is photo sensitive. Therefore, bonding pads 32 can subsequently be exposed by a conventional photolithography technique. Following photolithography, stress buffer material 28 may be cured at elevated temperature per conventional processes.

An adhesive 34 is applied to top surface 30 of die 24. More specifically, adhesive 34 is applied onto stress buffer material 28. Adhesive 34 may be a conventional non-conductive paste, or alternatively, a non-conducive adhesive film. A magnetic shield 36 is bonded to top surface 30 using adhesive 34, and a die 38 is attached to magnetic shield 36 using a die attach adhesive 37.

Like die 24, a top surface 40 of die 38 includes a stress buffer material 42 (e.g. polyimide). Die 38 further includes bonding pads 44, located near a perimeter of die 38, from which stress buffer material 42 has been removed by a photolithography technique. A adhesive 46 is applied to top surface 40 of die 38. More specifically, adhesive 46 is applied onto stress buffer material 42. Adhesive 46 may be a conventional non-conductive paste, or alternatively, a non-conducive adhesive film. A magnetic shield 48 is subsequently bonded to top surface 40 using adhesive 46 to form a die stack of magnetoresistive memory device 20.

Each of dies 24 and 38, respectively, includes an area having an underlying magnetically sensitive circuit 50. Magnetically sensitive circuit 50 includes magnetically sensitive material formed into, for example, an array of magnetic memory cells. The magnetic memory cells of circuit 50 are sensitive to internally induced magnetic fields, thereby limiting their density within each of dies 24 and 38. In addition, magnetic memory cells of circuit 50 of each of dies 24 and 38 are sensitive to external magnetic fields from one another, as well as from external components of a device in which magnetoresistive memory device 20 is located.

Interconnections 52 are formed between bond pads 32 and connection sites 54 located apart from die 24. Connection sites 54 may be, for example, package leads that enable connection of die 24 to the outside world. Connections 52 may be thin wires attached to bonding pads 32 and connection sites 54 using a wire bonding technique that employs some combination of heat, pressure, and/or ultrasonic energy to make a weld. Similarly, interconnections 56 are formed between bonding pads 44 and connection sites 58 located apart from die 38. Interconnections 56 may also be formed by a wire bonding technique.

Magnetic shields 36 and 48, respectively, protect dies 24 and 38 from external magnetic fields. These external magnetic fields can be produced by one another and by external components of a device in which magnetoresistive memory device 20 is located. Shields 36 and 48 may be formed of a metal having a relatively high permeability. One such metal having a high permeability is a nickel-iron alloy, such as the commercially available Mu-metal®. The high permeability metal is highly effective at screening static or low-frequency magnetic fields. High permeability metal can be provided in a sheet or foil format which can be readily fabricated into shields 36 and 48, and then subsequently adhered to dies 24 and 38 utilizing adhesives 34 and 46, respectively. Although nickel-iron alloy is discussed herein, it should be understood that other materials having relatively high permeability and that do not retain their magnetization upon the removal of the magnetic field may be used. Additionally, such material may be of a relatively soft magnetic material in some embodiments. Magnetic shields 36 and 48 can be fabricated to a specific dimension utilizing conventional photolithography and a wet etch process. Alternatively, a stamping technique may be employed to fabricate magnetic shields 36 and 48 to a precise dimension.

For the illustrated ball grid array (BGA) surface configuration, die 24 may further include a shield 60 adhered to a bottom surface 62 of die 24. Shield 60 may also be fabricated from a high permeability metal, such as a nickel-iron alloy, for additional magnetic shielding of bottom surface 62 of die 24. In other embodiments, shield 60 may be attached to die 24. In other embodiments in which magnetoresistive memory device 20 is implemented in a leadframe design, the leadframe may be fabricated from a magnetically permeable material for additional magnetic shielding of bottom surface 62 of die 24.

Magnetoresistive memory device 20 utilizes a stacked chip-scale package technology in a package-on-package configuration that vertically combines dies 24 and 38 to form a die stack 63. Stacked chip-scale packaging can be used with dies 24 and 38 to effectively double the memory capacity without changing the package size. For example, two known MRAM dies can be stacked together using stacked chip-scale package technology to double the memory capacity. Accordingly, this stacked configuration combined with the BGA surface mount techniques, and the magnetic shielding provided by magnetic shields 36 and 48, respectively, provides high density and high performance memory capacity while enabling manufacturers to maintain size reduction design requirements.

Magnetic shield 36 serves another function in the stacked configuration of magnetoresistive memory device 20. In a stacked device that has at least two dies of a similar size, a spacer is typically required to raise one of the dies slightly higher so that it will not touch the interconnecting wires from the lower die. Magnetic shield 36 acts as a spacer to allow space for interconnections 52 so that die 38 will not touch interconnections 52.

Figure 2:
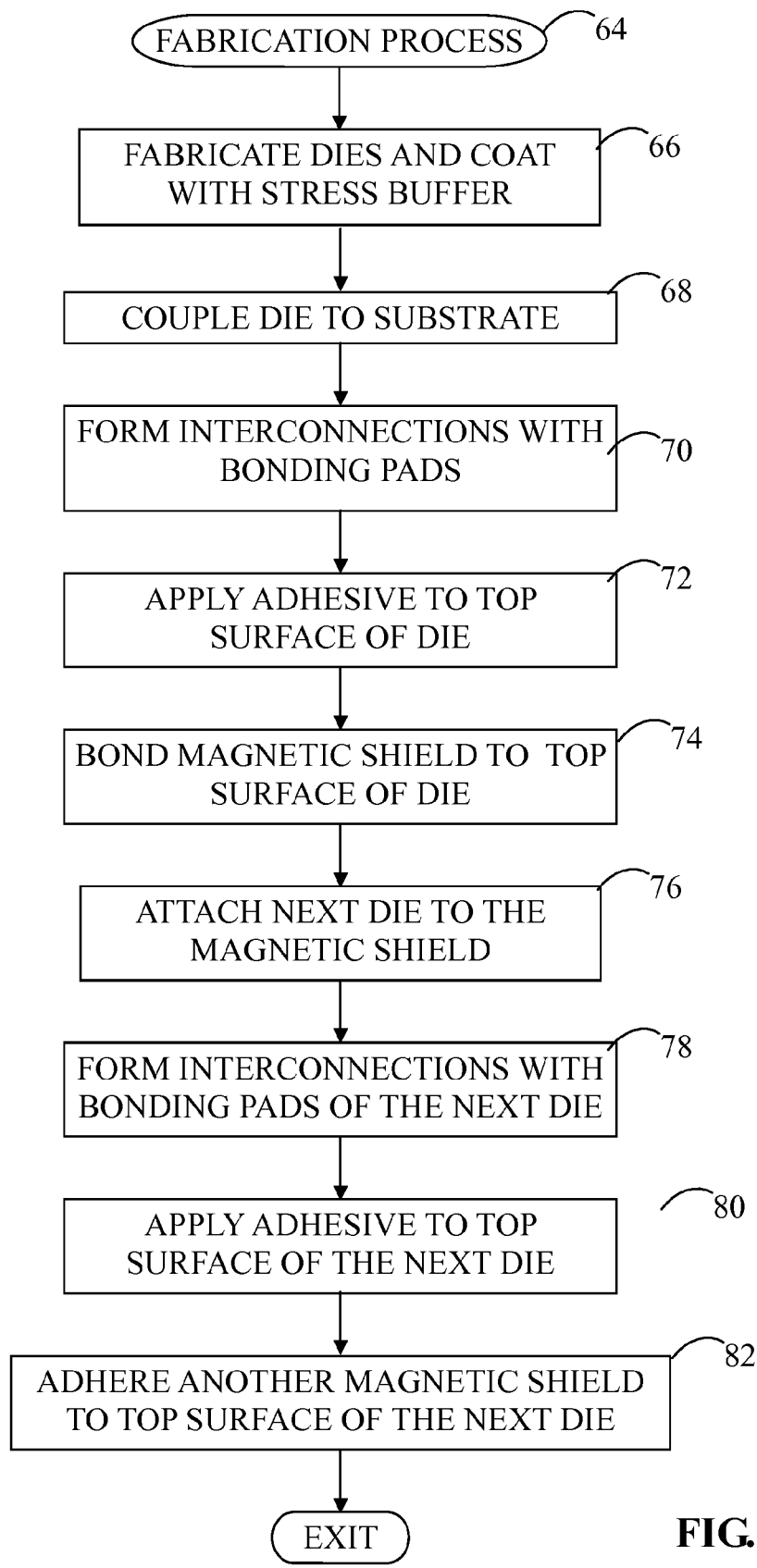
FIG. 2 shows a flowchart of a fabrication process for producing the magnetoresistive memory device.

Stress buffer material 28 and stress buffer material 42 are used as protective overcoats for die 24 and die 38, respectively. Stress buffer materials 28 and 42 protect their respective dies 24 and 38 from damage during handling and when magnetoresistive memory device 20 is placed in a high temperature environment, such as thermal cycling during reliability testing. That is, materials 28 and 42 provide buffering between the thermally mismatched silicon of dies 24 and 38, respectively, and the corresponding magnetic shields 36 and 48, respectively. This buffering decreases the potential for cracking to occur in dies 24 and 38 when placed in a high temperature environment. Although polyimide is discussed herein, it should be understood that other known and upcoming materials that can serve the function of a stress buffer may alternatively be utilized FIG. 2 shows a flowchart of a fabrication process 64 for packaging magnetoresistive memory device 20 (FIG. 1). Fabrication process 64 produces the stacked chip-scale configuration of device 20 which results in a high memory capacity of device 20 and the effective shielding of dies 24 and 38, respectively. In addition, fabrication process 64 is cost effectively implemented utilizing existing manufacturing tools. FIGS. 3-7 show cross-sectional views of sequential steps in the formation of magnetoresistive memory device 20 in accordance with fabrication process 64. Specific figures will be referred to below in connection with particular tasks of fabrication process 64. Additionally, only those reference numerals pertinent to the understanding of a particular task will be presented in each of FIGS. 3-7 for clarity of illustration. The following operations describe the fabrication process for a single magnetoresistive memory device 20. However, those skilled in the art will readily recognize that the following fabrication process applies equivalently to the concurrent fabrication of multiple devices 20.

Fabrication process 64 begins with a task 66. At task 66, dies 24 and 38 are fabricated utilizing known fabrication techniques. As known to those skilled in the art, each of dies 24 and 38 is a small block of semiconducting material, on which a given functional circuit, in this case magnetically sensitive circuit 50, is fabricated. Typically, a plurality of magnetically sensitive circuits 50 are produced on a single wafer. In one embodiment, the wafer is coated with a stress buffer, referred to herein as stress buffer material 28 on die 24 and stress buffer material 42 on die 38. Bonding pads 32 and 44, respectively, are opened by photolithography. The stress buffer material, which may be polyimide, is cured at an elevated temperature in inert atmosphere. Next, the wafer is backgrinded to thin to a desired thickness and the wafer is diced to form dies 24 and 38, respectively. Dies 24 and 38 are described as being fabricated on a common wafer. However, dies 24 and 38 need not be fabricated on a common wafer. Moreover, dies 24 and 38 need not have identical magnetically sensitive circuits 50 produced thereon.

Figure 3:
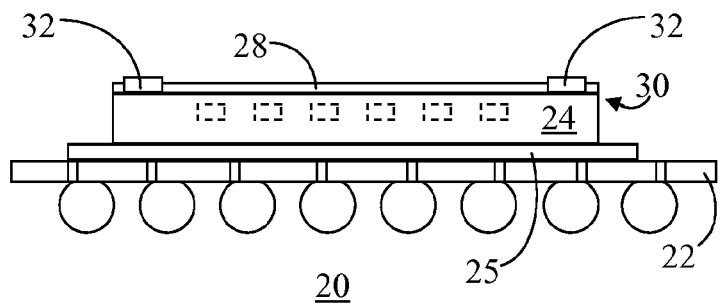
FIGS. 3-7 show cross-sectional views of sequential steps in the formation of the magnetoresistive memory device of FIG. 1 in accordance with the fabrication process of FIG. 2.

Following task 66, a task 68 is performed. Referring to FIG. 3 in connection with task 68, FIG. 3 shows a cross-sectional view of magnetoresistive memory device 20 partially constructed in accordance with task 68. At task 68, die 24 is coupled to substrate 22. More specifically, die 24 is coupled to substrate 22 utilizing conductive adhesive 25. It should be noted that stress buffer 28 was dispensed on top surface 30 and bonding pads 32 were opened during the prior die fabrication task 66. It should further be noted that when shield 60 is used on bottom surface 62 of die 24, shield 60 is adhered to bottom surface prior to die 24 being coupled to substrate 22.

Figure 4:
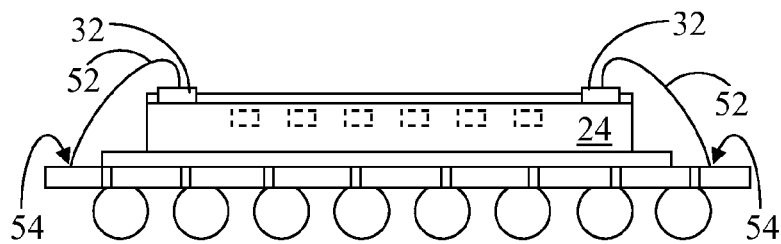

After die 24 is coupled to substrate 22 at task 68, a task 70 is performed. Referring to FIG. 4 in connection with task 70, FIG. 4 shows a cross-sectional view of magnetoresistive memory device 20 partially constructed in accordance with task 70. At task 70, interconnections 52 are formed between bonding pads 32 and connection sites 54 utilizing, for example, conventional wire bonding techniques.

Figure 5:
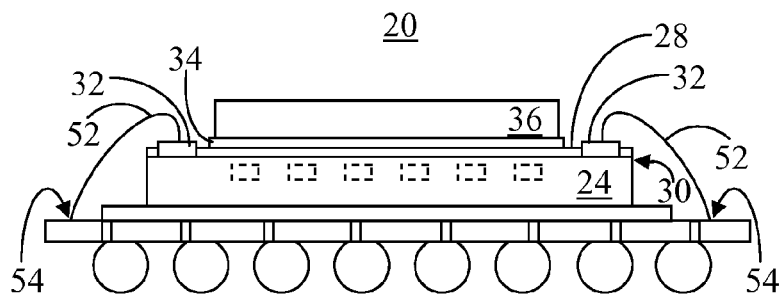

Next, a task 72 and subsequently a task 74 are performed. Referring to FIG. 5 in connection with tasks 72 and 74, FIG. 5 shows a cross-sectional view of magnetoresistive memory device 20 partially constructed in accordance with tasks 72 and 74. At task 72 and after interconnections 52 are formed between bonding pads 32 and connection sites 54, adhesive 34 is applied to top surface 30 of die 24 such that stress buffer material 28 is interposed between adhesive 34 and die 24. At task 74, magnetic shield 36 is bonded to top surface 30 of die 24 using adhesive 34. Consequently, stress buffer material 28 is interposed between die 24 and magnetic shield 36. In accordance with manufacturing processes, a die bonder may be used to attach magnetic shield 36 to top surface 30 of die 24.

In some instances, and particularly when adhesive 34 is of a paste consistency, as magnetic shield 36 is bonded to top surface 30, adhesive 34 can leak out from the perimeter of magnetic shield 36 and come into contact with and/or cover bonding pads 32. Accordingly, interconnections 52 are formed at task 70 prior to the application of adhesive 34 at task 72 and bonding of magnetic shield 36 at task 74 so that viable electrical connections can be made. In addition, adhesive 34 is non-conductive so that shorting between bonding pads 32 cannot occur.

Figure 6:
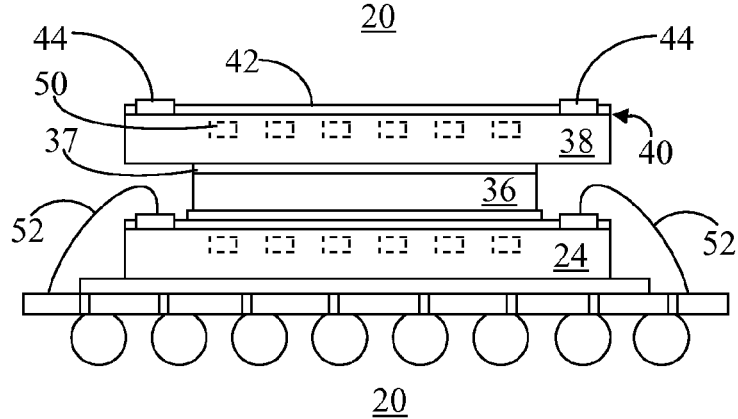

Following tasks 72 and 74, a task 76 is performed. Referring to FIG. 6 in connection with task 76, FIG. 6 shows a cross-sectional view of magnetoresistive memory device 20 partially constructed in accordance with task 76. At task 76, die attach adhesive 37 is applied to one of magnetic shield 36 and a bottom surface of die 38. Die 38 is then attached to magnetic shield 36. It should be noted that stress buffer material 42 was dispensed on top surface 40 and bonding pads 44 were opened during the prior die fabrication task 66. Magnetic shield 36 spaces die 38 sufficiently apart from die 24 so that die 38 does not touch interconnections 52.

Figure 7:
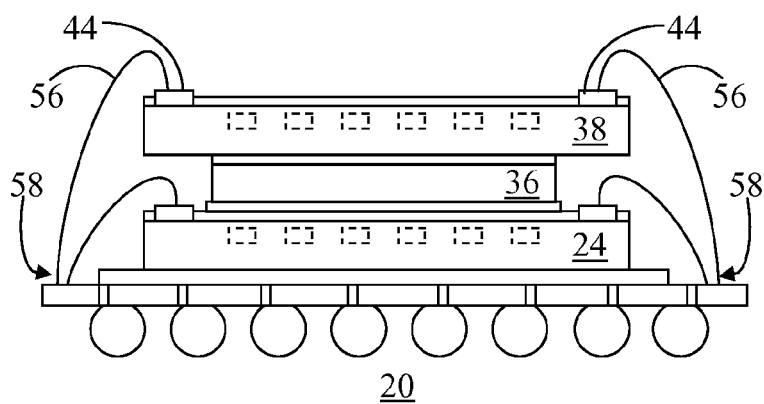

After die 38 is attached to magnetic shield 36 at task 76, a task 78 is performed. Referring to FIG. 7 in connection with task 78, FIG. 7 shows a cross-sectional view of magnetoresistive memory device 20 partially constructed in accordance with task 78. At task 78, interconnections 56 are formed between bonding pads 44 of die 38 and connection sites 58 utilizing conventional wire bonding techniques.

Next, a task 80 and subsequently a task 82 are performed. Referring back to FIG. 1 in connection with tasks 80 and 82, at task 80 and after interconnections 56 are formed between bonding pads 44 and connection sites 58, adhesive 46 is applied to top surface 40 of die 38 such that stress buffer material 42 is interposed between adhesive 46 and die 38. At task 82, magnetic shield 48 is adhered to top surface 40 of die 38 using adhesive 46. Consequently, stress buffer material 42 is interposed between die 38 and magnetic shield 48. In accordance with manufacturing processes, a die bonder may be used to attach magnetic shield 48 to top surface 40 of die 38.

In some instances, and particularly when adhesive 46 is of a paste consistency, as magnetic shield 48 is adhered to top surface 40, adhesive 46 can leak out from the perimeter of magnetic shield 48 and come into contact with and/or cover bonding pads 44. Accordingly, interconnections 56 are formed at task 78 prior to the application of adhesive 46 at task 80 and adhering of magnetic shield 48 at task 82, so that viable electrical connections can be made. In addition, adhesive 46 is non-conductive so that shorting between bonding pads 44 cannot occur. Following task 82, fabrication process 64 exits with a die stack 63 of shielded dies formed in a stacked chip-set package configuration. Of course, other conventional fabrication processes may subsequently occur such as encasing die stack 63 in a molding compound.

Fabrication process 64 describes a stacked configuration of two dies. However, it should be understood that the process steps can be repeated to form a stacked chip-scale package configuration of more than two dies containing magnetically sensitive material.

An embodiment described herein comprises a magnetoresistive memory device in a stacked chip-scale package configuration. The device includes at least two dies containing magnetically sensitive material and the at least two dies are effectively shielded from external magnetic fields. Another embodiment comprises a method for producing an integrated circuit that includes at least two dies containing magnetically sensitive material. The method provides stepwise assembly methodology that efficiently and cost effectively produces the stacked configuration of at least two dies. The packaging methodology results in a high performance memory device having higher effective density than prior art devices.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A magnetoresistive memory device comprising:
    a substrate;
    a first die coupled to said substrate, said first die containing magnetoresistive memory cells and having a first top surface with first bonding pads positioned thereon, said first bonding pads being interconnected with associated first connection sites spaced apart from said first die;
    a first adhesive applied to said first top surface, excluding application of said first adhesive on said first bonding pads when said first adhesive is applied to said first top surface;
    a first magnetic shield bonded to a first top surface of said first die via said first adhesive;
    a second die attached to said first magnetic shield, said second die containing said magnetoresistive memory cells and having a second top surface with second bonding pads positioned thereon, said second bonding pads being interconnected with associated second connection sites spaced apart from said first die;
    a second adhesive applied to said second top surface, excluding application of said second adhesive on said second bonding pads when said second adhesive is applied to said second top surface; and
    a second magnetic shield adhered to said second top surface using said second adhesive.

2. A magnetoresistive memory device as claimed in claim 1 wherein each of said first and second adhesives are a non-conductive adhesive paste.

3. A magnetoresistive memory device as claimed in claim 1 wherein each of said first and second magnetic shields is formed from a metal material provided in a sheet format.

4. A magnetoresistive memory device as claimed in claim 1 further comprising:
    a first stress buffer material interposed between said first top surface of said first die and said first magnetic shield; and
    a second stress buffer material interposed between said second top surface of said second die and said second magnetic shield.

5. A magnetoresistive memory device as claimed in claim 1 further comprising:
    a third magnetic shield adhered to a bottom surface of said first die.

6. A magnetoresistive memory device as claimed in claim 1 wherein the substrate comprises:
    a leadframe formed from a magnetic permeable material.

* * * * *